(12) United States Patent
Li

(10) Patent No.: US 10,680,048 B2
(45) Date of Patent: Jun. 9, 2020

(54) ARRAY SUBSTRATE AND DISPLAY PANEL USING THE SAME

(71) Applicants: HKC CORPORATION LIMITED, Guangdong (CN); CHONGQING HKC OPTOELECTRONICS TECHNOLOGY CO., LTD., Chongqing (CN)

(72) Inventor: Zeyao Li, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 324 days.

(21) Appl. No.: 15/745,550

(22) PCT Filed: Dec. 19, 2017

(86) PCT No.: PCT/CN2017/117079
§ 371 (c)(1),
(2) Date: Jan. 17, 2018

(87) PCT Pub. No.: WO2019/071814
PCT Pub. Date: Apr. 18, 2019

(65) Prior Publication Data
US 2020/0058722 A1     Feb. 20, 2020

(30) Foreign Application Priority Data

Oct. 12, 2017   (CN) .......................... 2017 1 0946991

(51) Int. Cl.
*G09G 3/00*     (2006.01)
*H01L 27/32*    (2006.01)

(52) U.S. Cl.
CPC ...... *H01L 27/3262* (2013.01); *H01L 27/3276* (2013.01)

(58) Field of Classification Search
CPC ... G09G 2300/0408; G09G 2300/0426; G09G 2310/0283; G09G 2310/0286; G09G 3/3677
See application file for complete search history.

(56) References Cited

FOREIGN PATENT DOCUMENTS

| CN | 102903322 A | 1/2013 |
|----|-------------|--------|
| CN | 103700354 A | 4/2014 |

(Continued)

OTHER PUBLICATIONS

International Search Report dated Jul. 11, 2018, in the corresponding PCT application PCT/CN2017/117079, 9 pages in Chinese, 2 pages in English.

*Primary Examiner* — Insa Sadio
(74) *Attorney, Agent, or Firm* — Juan Carlos A. Marquez; Marquez IP Law Office, PLLC

(57) ABSTRACT

An array substrate comprises a substrate including a displaying area and a connecting layout area disposed on the periphery of the displaying area, a plurality of thin film transistors, a plurality of sub-pixels and a plurality of signal lines disposed on the displaying area. The sub-pixels are electrically coupled to the plurality of thin film transistors respectively, the thin film transistors are electrically coupled to the plurality of signal lines respectively, and a plurality of input interfaces of the plurality of signal lines are disposed on the connecting layout area. Further, a driving module is disposed on the connecting layout area and the driving module includes a plurality of output interfaces. Moreover, a plurality of connecting lines are disposed between the plurality of input interfaces and the plurality of output interfaces and configured to electrically couple the plurality (Continued)

of input interfaces and the plurality of output interfaces respectively.

20 Claims, 7 Drawing Sheets

(56) References Cited

FOREIGN PATENT DOCUMENTS

| CN | 103713405 A | 4/2014 |
|---|---|---|
| CN | 107765482 A | 3/2018 |

ARRAY SUBSTRATE AND DISPLAY PANEL USING THE SAME

FIELD OF THE INVENTION

The present application relates to the arrangement of the connecting lines on the layout area of a display field, and more particularly to an array substrate and display apparatus having the same.

BACKGROUND OF THE INVENTION

When a thin film transistor liquid crystal display (TFT-LCD) panel is normally displayed, a gate driver and a source driver, and combined with a plurality of gate lines and a plurality of data lines arranged on the substrate in a cross manner are used for controlling each sup-pixel of the display panel, and therefore the image displaying is realized.

The driving method of the display apparatus comprises a system circuit board providing a plurality of colored compressed signals, for example red/green/blue compressed signals, control signals, power signal and power source to the control board. After those signals processed by the timing controller on the control board and accompanying a power source processed by a driving circuit are transmitted to the source circuit and the gate circuit of the printed circuit board simultaneously. The data and power of necessity are transmitted to the displaying area through the gate lines, data lines, power lines and the like, so that the display panel of the display apparatus obtains the power source and signals for presenting the images.

However, the important components employed on the display panel such as integrated circuits (ICs), control chips and the like, generally not to be designed and integrated by the display apparatus manufacturer. Therefore, designers of the display apparatus manufacturer need to obtain the timing sequence of the signal output of chips or the integrated circuits and truth table and other related information, the internal firmware read and write mode, in order to adjust the signal output mode of the chip or the integrated circuit by specific software. After the components are adjusted, the components also need to be tested to ensure the functions are correctly, thereby a considerable amount of labor and time is wasted.

SUMMARY OF THE INVENTION

In order to solve the above-mentioned problems, it is an object of the present invention to provide an array substrate, a display panel equipped with the same and its applications. By implied with the arrangement of the connecting lines on the connecting layout area of the array substrate to change the timing sequence of the control signals for displaying area of the display panel.

The purpose of the present invention and the aforementioned technical problem to be solved can be realized by the following technical embodiments. The present invention provides an array substrate, the array substrate comprises a substrate including a displaying area and a connecting layout area disposed on the periphery of the displaying area, a plurality of thin film transistors, a plurality of sub-pixels and a plurality of signal lines disposed on the displaying area. Wherein the plurality of sub-pixels are electrically coupled to the plurality of thin film transistors respectively, the plurality of thin film transistors are electrically coupled to the plurality of signal lines respectively, and a plurality of input interfaces of the plurality of signal lines are disposed on the connecting layout area. Further, a driving module is disposed on the connecting layout area and the driving module includes a plurality of output interfaces. Moreover, a plurality of connecting lines are disposed between the plurality of input interfaces and the plurality of output interfaces and configured to electrically couple the plurality of input interfaces and the plurality of output interfaces respectively. Wherein at least one of the plurality of connecting lines is in a cross-line configuration, a line configuration sequence of the plurality of input interfaces is different from a line configuration sequence of the plurality of output interfaces.

The purpose of the present invention and the aforementioned technical problem to be solved can be further realized by the following technical embodiments.

In one embodiment of the present invention, wherein the line configuration sequence of the plurality of input interfaces is different from the line configuration sequence of the plurality of output interfaces.

In one embodiment of the present invention, wherein the plurality of connecting lines includes a plurality of line combinations, and at least one line of one of the plurality of line combinations is in a cross-line configuration.

In one embodiment of the present invention, wherein the plurality of line combinations includes at least one of a two-line combination, a three-line combination, and a four-line combination.

In one embodiment of the present invention, wherein the driving module outputs a plurality of control signals through the plurality of output interfaces in a first time sequence, the plurality of control signals received by the plurality of input interfaces are continued in a second time sequence, and the plurality of connecting lines are configured to receive the plurality of control signals through the plurality of output interfaces with the first time sequence and to transmit the plurality of control signals to the plurality of input interfaces with the second time sequence.

In one embodiment of the present invention, wherein the driving module includes a chip on film structure and is pressed on the edge of the substrate, and the chip on film structure includes a plurality of output interfaces.

In one embodiment of the present invention, wherein the chip on film structure is at least one of the gate electrode chip on film structure and the source electrode chip on film structure.

In one embodiment of the present invention, wherein the plurality of connecting lines are disposed on a fan out region of the connecting layout area.

Another object of the present invention is to provide an array substrate. The array substrate comprises a substrate including a displaying area and a connecting layout area disposed on the periphery of the displaying area, a plurality of thin film transistors, a plurality of sub-pixels and a plurality of signal lines disposed on the displaying area. Wherein the plurality of sub-pixels are electrically coupled to the plurality of thin film transistors respectively, the plurality of thin film transistors are electrically coupled to the plurality of signal lines respectively, and a plurality of input interfaces of the plurality of signal lines are disposed on the connecting layout area. Wherein the plurality of input interfaces include at least one first input interface and at least one second input interface. Further, a driving module includes at least one first output interface and at least one second output interface, and two line combinations are disposed between the driving module and the substrate and including a first line combination and a second line combination, wherein the first line combination is disposed between the first output interface and the second input interface and the second line combination is disposed between the second output interface and the first input interface, the second line combination is configured as a polygonal line, a straight line, a curved line or an oblique line, and the first line combination is in a cross-line configuration.

Another object of the present invention is to provide a display panel. The display panel of the present invention comprises an array substrate, an opposite substrate disposed opposite to the array substrate. Wherein the array substrate comprises a substrate including a displaying area and a connecting layout area disposed on the periphery of the displaying area, a plurality of thin film transistors, a plurality of sub-pixels and a plurality of signal lines disposed on the displaying area. Wherein the plurality of sub-pixels are electrically coupled to the plurality of thin film transistors respectively, the plurality of thin film transistors are electrically coupled to the plurality of signal lines respectively, and a plurality of input interfaces of the plurality of signal lines are disposed on the connecting layout area. Further, a driving module is disposed on the connecting layout area and including a plurality of output interfaces, and a plurality of connecting lines are disposed between the plurality of input interfaces and the plurality of output interfaces and configured to electrically couple the plurality of input interfaces and the plurality of output interfaces respectively. Wherein at least one of the plurality of connecting lines is in a cross-line configuration, a line configuration sequence of the plurality of input interfaces is different from a line configuration sequence of the plurality of output interfaces.

Under the consideration of substantially not to alter the existing production process, the display panel equipped with the array substrate of the present invention is possible to maintain the original process requirements and product costs. By virtue of the arrangement of the connecting lines on the connecting layout area of the present invention, it can change the timing sequence of the control signals for displaying area of the display panel and no need to change the timing sequence of the output signals of a driving module such as a driver IC or a drive control circuit, therefore, the adjusting cost of the driving module can be reduced.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures.

DETAILED DESCRIPTION OF THE EMBODIMENTS

Figure 1A:
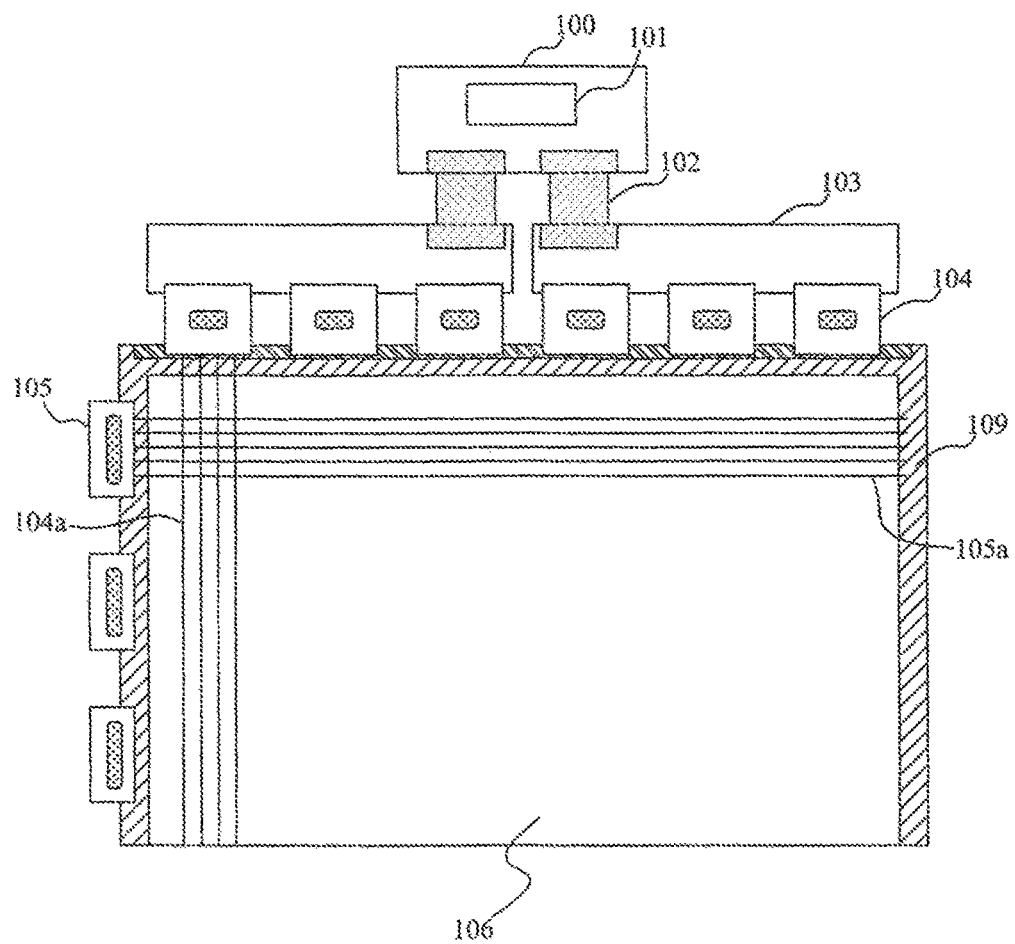
FIG. 1a is a schematic diagram of an exemplary display apparatus.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

Furthermore, in the specification, "on" implies being positioned above or below a target element and does not imply being necessarily positioned on the top on the basis of a gravity direction.

For further explaining the technical means and efficacy of the present application intended to file, an array substrate, a display panel equipped with the same and its applications including the embodiments, structures, features and effects thereof according to the present invention will be apparent from the following detailed description and accompanying drawings.

FIG. 1a is a schematic diagram of a display apparatus. Referring to FIG. 1a, a display apparatus comprises a control board 100, a printed circuit board 103, a plurality of source electrode chip on film structures 104 and a plurality of gate electrode chip on film structures 105. Wherein the control board 100 includes a timing controller (TCON) 101, the printed circuit board 103 is connected to the control board through a flexible flat cable (FFC) 102, and the plurality of source electrode chip on film structures 104 and the plurality of gate electrode chip on film structures 105 are connected to a plurality of source lines 104a and a plurality of gate lines 105a disposing on the displaying area 106 respectively.

In some embodiments, the driving method of the display apparatus comprises a system circuit board providing a plurality of colored compressed signals, for example red/green/blue compressed signals, control signals, power signal and power source to the control board 100. After those signals processed by the timing controller 101 on the control board 100 and accompanying a power source processed by a driving circuit are transmitted to the source circuit and the gate circuit of the printed circuit board 103 through a flexible flat cable (FFC) 102 simultaneously. Then, the data and power of necessity are transmitted to the displaying area 106 through the source electrode chip on film structures 104 and the gate electrode chip on film structures 105, so that the display panel obtains the power source and signals for presenting the images.

Figure 1B:
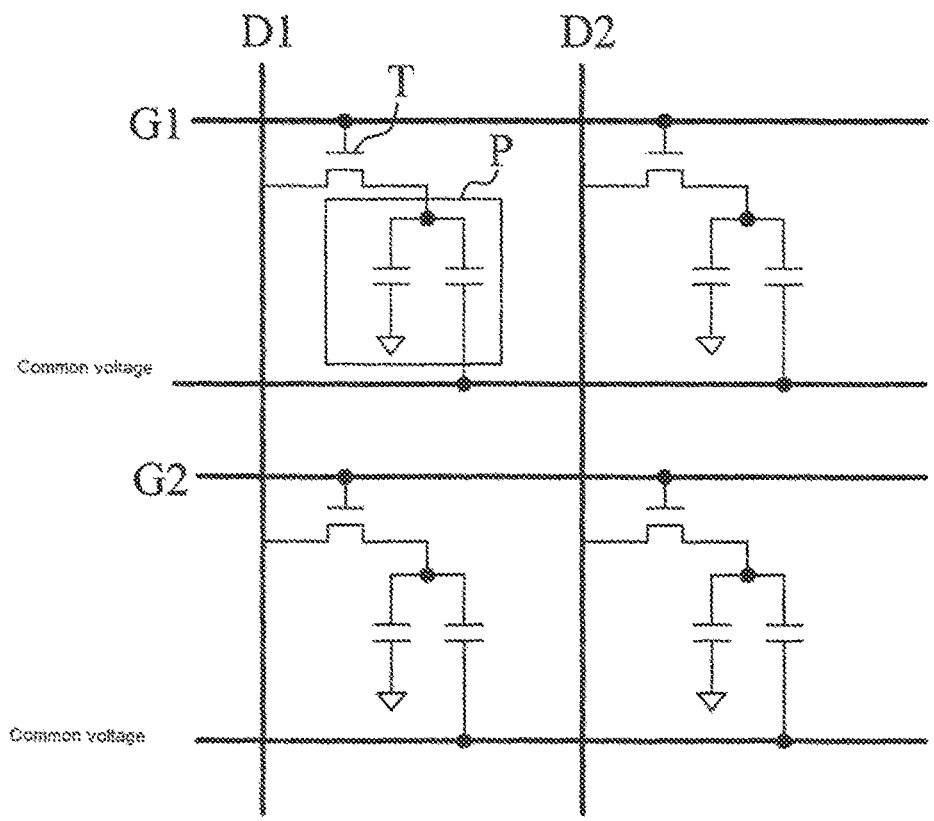
FIG. 1b is a schematic diagram of sub-pixel unit configuration of an exemplary display apparatus.

FIG. 1b is a schematic diagram of sub-pixel unit configuration of a display apparatus. Referring to FIG. 1a and FIG. 1b at the same time, the gate driving unit 105 provides scan signals to the gate lines 105a line by line, and provides scan signals to a row of gate lines 105a for each scanning period. The source lines 104a of the display panel are opened line by line, and the source driving unit 104 provides data to the sub-pixel unit P through the source lines 104a.

Figure 1C:
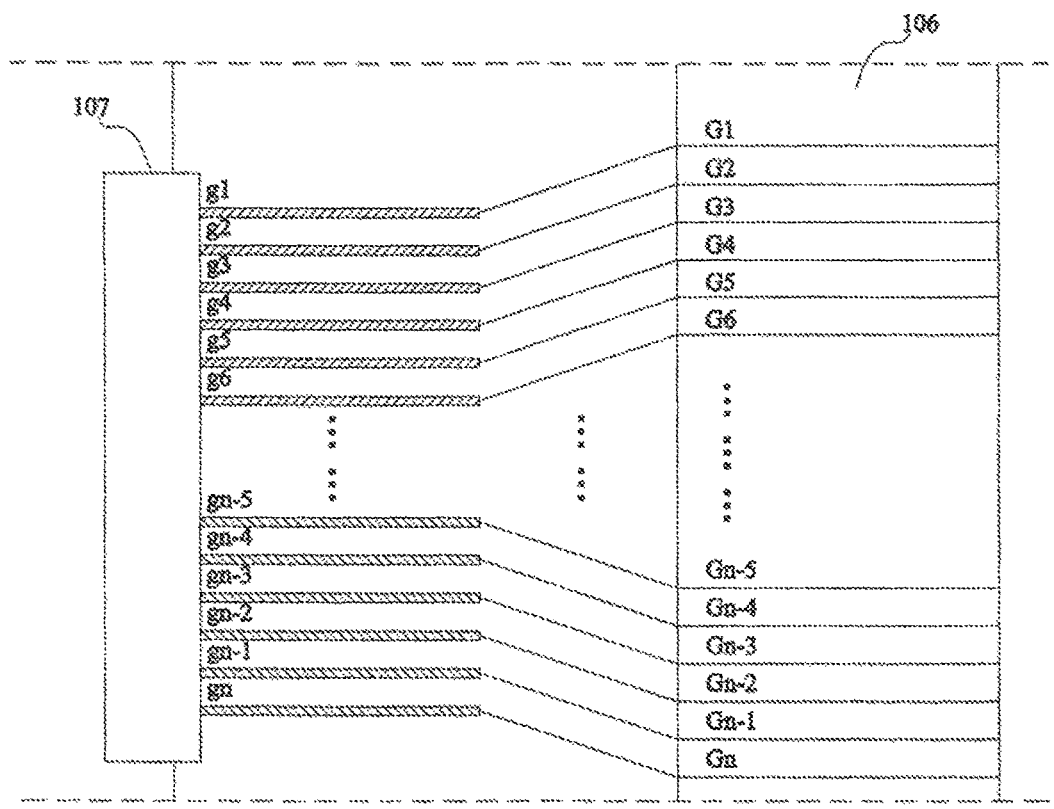
FIG. 1c is a schematic diagram of fan out region of an exemplary display apparatus.

FIG. 1c is a schematic diagram of fan out region of a display apparatus. Referring to FIG. 1a, FIG. 1b and FIG. 1c at the same time, as shown in FIG. 1c, a plurality of integrated circuits (ICs) are disposed on the corresponding chip on film structures. In some embodiments, the channels of the integrated circuit are generally respectively connected to the conductive lines of the displaying area 106 according to the sequence of the channels. According to the differences of the integrated circuits, the connected conductive lines are different. Such as the gate integrated circuit is connected to the scan line (gate line), wherein the source integrated circuit is connected with a data line (source line).

As shown in FIG. 1c, a gate integrated circuit 107 is used as an example, the channel arrangement sequence of the gate integrated circuit 107 is from g1 to gn, and the signal output timing sequence of the gate integrated circuit is also adjusted as a data channel signal output timing sequence.

However, the components such as integrated circuits (ICs), control chips and the like, the output channel and the signal output timing sequence is not necessarily shown in FIG. 1c and it is also necessary for the designer to look ahead. Moreover, such components do not necessarily have to be designed and manufactured by the display apparatus manufacturer. Therefore, designers need to obtain the timing sequence of the signal output of the integrated circuit and truth table and other related information, the internal firmware read and write mode, in order to adjust the signal output mode of the chip or the integrated circuit by specific software. After the components are adjusted, the components also need to be tested to ensure the functions are correctly, thereby a considerable amount of labor and time is wasted.

Figure 2A:
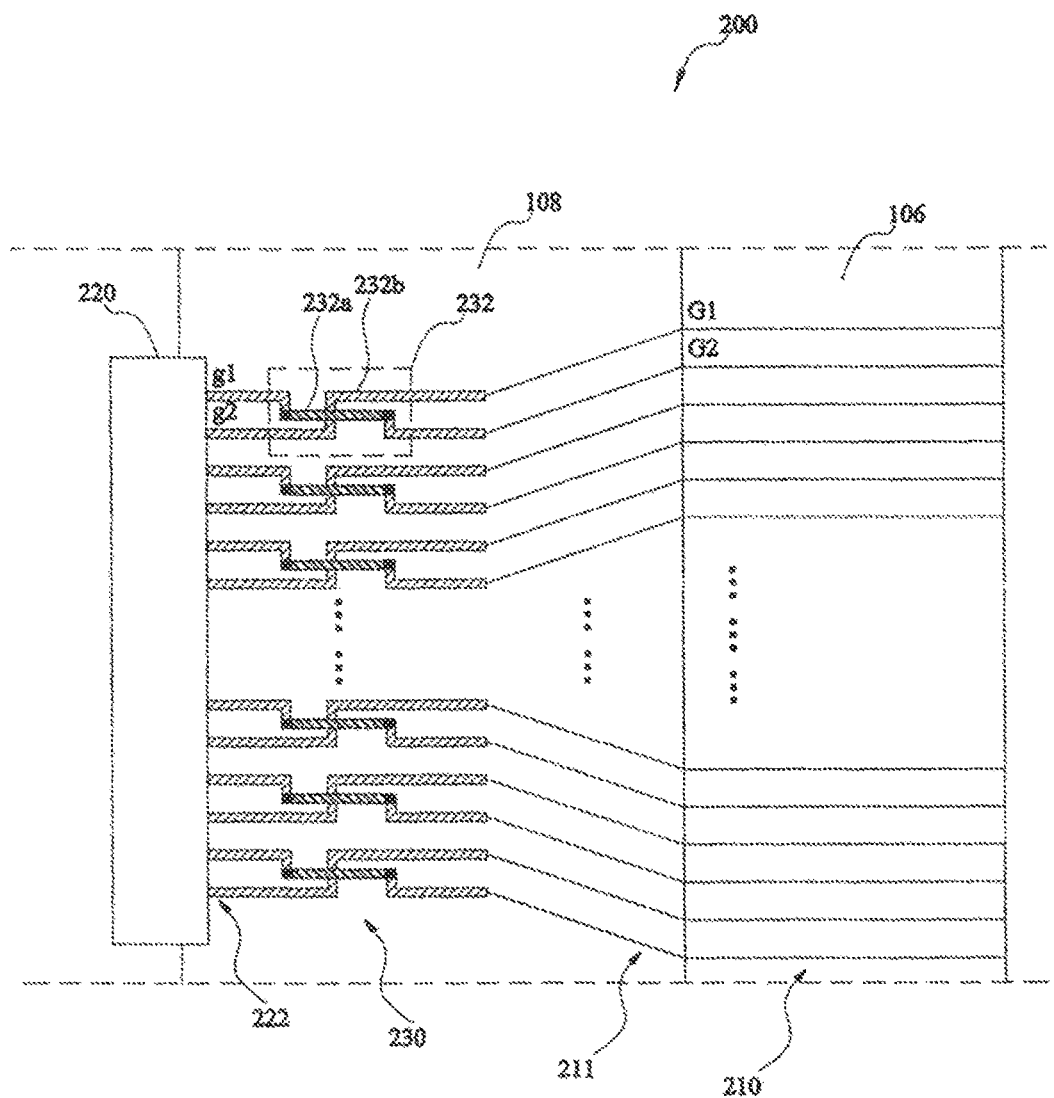
FIG. 2a is a schematic diagram showing a connecting layout area of an array substrate according to one embodiment of the present invention.

FIG. 2a is a schematic diagram showing a connecting layout area of an array substrate according to one embodiment of the present invention. Also referring to FIG. 1a, FIG. 1b and FIG. 1c at the same time for easily understanding the components arrangement of the existing display panel. Referring to FIG. 2a, in one embodiment of the present invention, an array substrate comprises a substrate 200 including a displaying area 106 and a connecting layout area 108 disposed on the periphery of the displaying area, a plurality of thin film transistors T, a plurality of sub-pixels P and a plurality of signal lines 210 disposed on the displaying area 106. Wherein the plurality of sub-pixels P are electrically coupled to the plurality of thin film transistors T respectively, the plurality of thin film transistors T are electrically coupled to the plurality of signal lines 210 respectively, and a plurality of input interfaces 211 of the plurality of signal lines 210 are disposed on the connecting layout area 108. Further, a driving module 220 is disposed on the connecting layout area 108 and the driving module 220 includes a plurality of output interfaces. Moreover, a plurality of connecting lines 230 are disposed between the plurality of input interfaces 211 and the plurality of output interfaces 222 and configured to electrically couple the plurality of input interfaces 211 and the plurality of output interfaces 222 respectively. Wherein at least one line of the plurality of connecting lines 230 is in a cross-line configuration, a line configuration sequence of the plurality of input interfaces 211 is different from a line configuration sequence of the plurality of output interfaces 222.

In one embodiment of the present invention, wherein the plurality of connecting lines includes a plurality of line combinations, and at least one of the plurality of line combinations is in a cross-line configuration.

In one embodiment of the present invention, wherein the driving module 210 outputs a plurality of control signals through the plurality of output interfaces 222 in a first time sequence, the plurality of control signals received by the plurality of input interfaces 211 are continued in a second time sequence, and the plurality of connecting lines 230 are configured to receive the plurality of control signals through the plurality of output interfaces 222 with the first time sequence and to transmit the plurality of control signals to the plurality of input interfaces 211 with the second time sequence.

As shown in FIG. 2a, in one embodiment of the present invention, wherein the plurality of line combinations includes a two-line combination 232. The two-line combination 232 includes a first line combination 232a and a second line combination 232b. Wherein the second line combination 232b is configured as a polygonal line and the first line combination 232a is in a cross-line configuration. Wherein the first line combination 232a is disposed between the first output interface g1 and the second input interface G2 and the second line combination 232b is disposed between the second output interface g2 and the first input interface G1. It is assumed that the timing sequence of the control signals passing through the output interfaces is from g1 to g2 (g1->g2), and the timing sequence of the control signals reaching the input interfaces is from G2 to G1 (G2->G1).

Figure 2B:
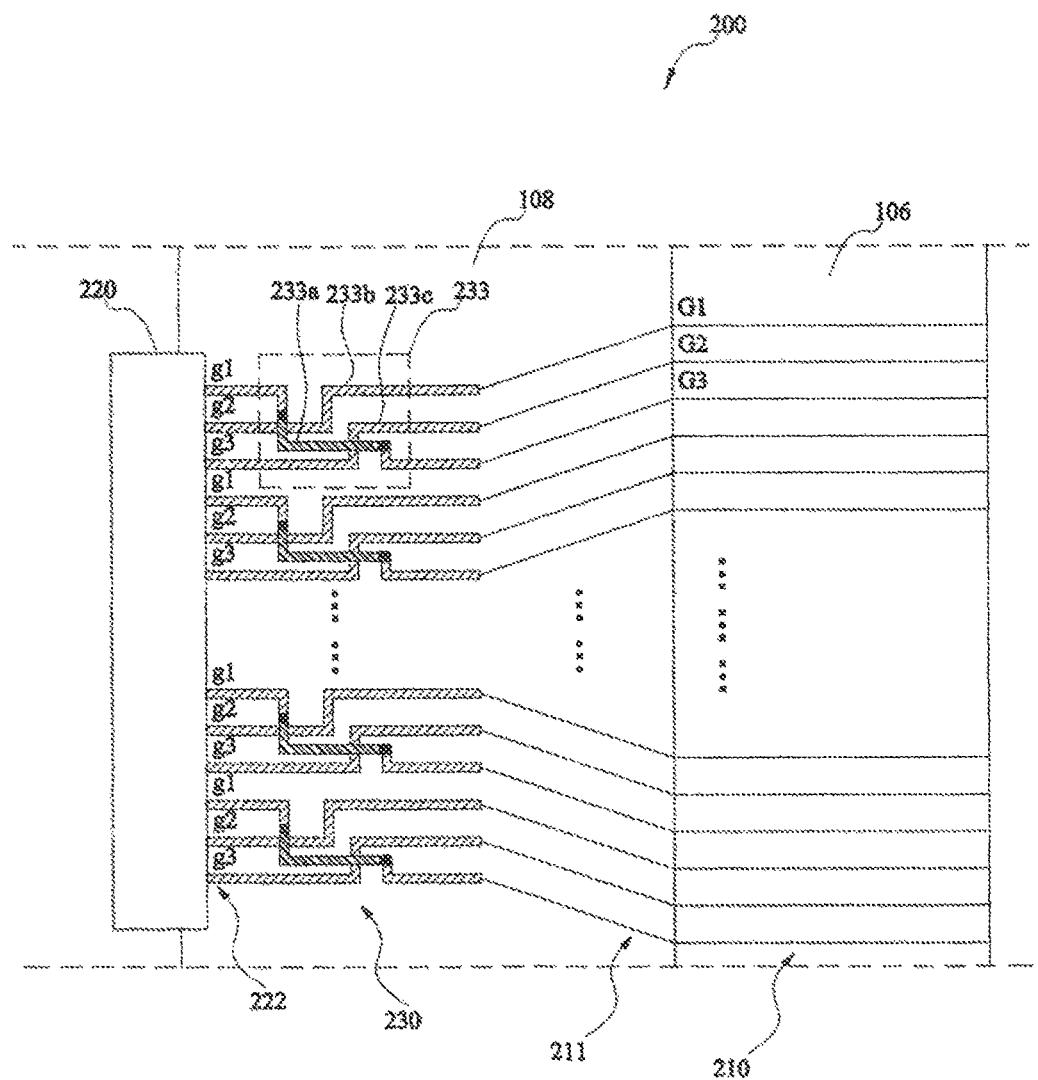
FIG. 2b is a schematic diagram showing another connecting layout area of an array substrate according to one embodiment of the present invention.

FIG. 2b is a schematic diagram showing another connecting layout area of an array substrate according to one embodiment of the present invention. Referring to FIG. 2b, in one embodiment of the present invention, wherein the plurality of line combinations include a three-line combination 233. The three-line combination 233 includes a first line combination 233a, a second line combination 233b and a third line combination 233c. Wherein the second line combination 233b and the third line combination 233c are configured as a polygonal line, and the first line combination 233a is in a cross-line configuration. Wherein the first line combination 233a is disposed between the output interface g1, the input interface G3, the second line combination 233b is disposed between the output interface g2 and the input interface G1, and the third line combination 233c is disposed between the output interface g3 and the input interface G2. It is assumed that the timing sequence of the control signals passing through the output interfaces is from g1, g2, then g3 (g1->g2->g3), and the timing sequence of the control signals reaching the input interfaces is from G3, G1, then G2 (G3->G1->G2).

Figure 2C:
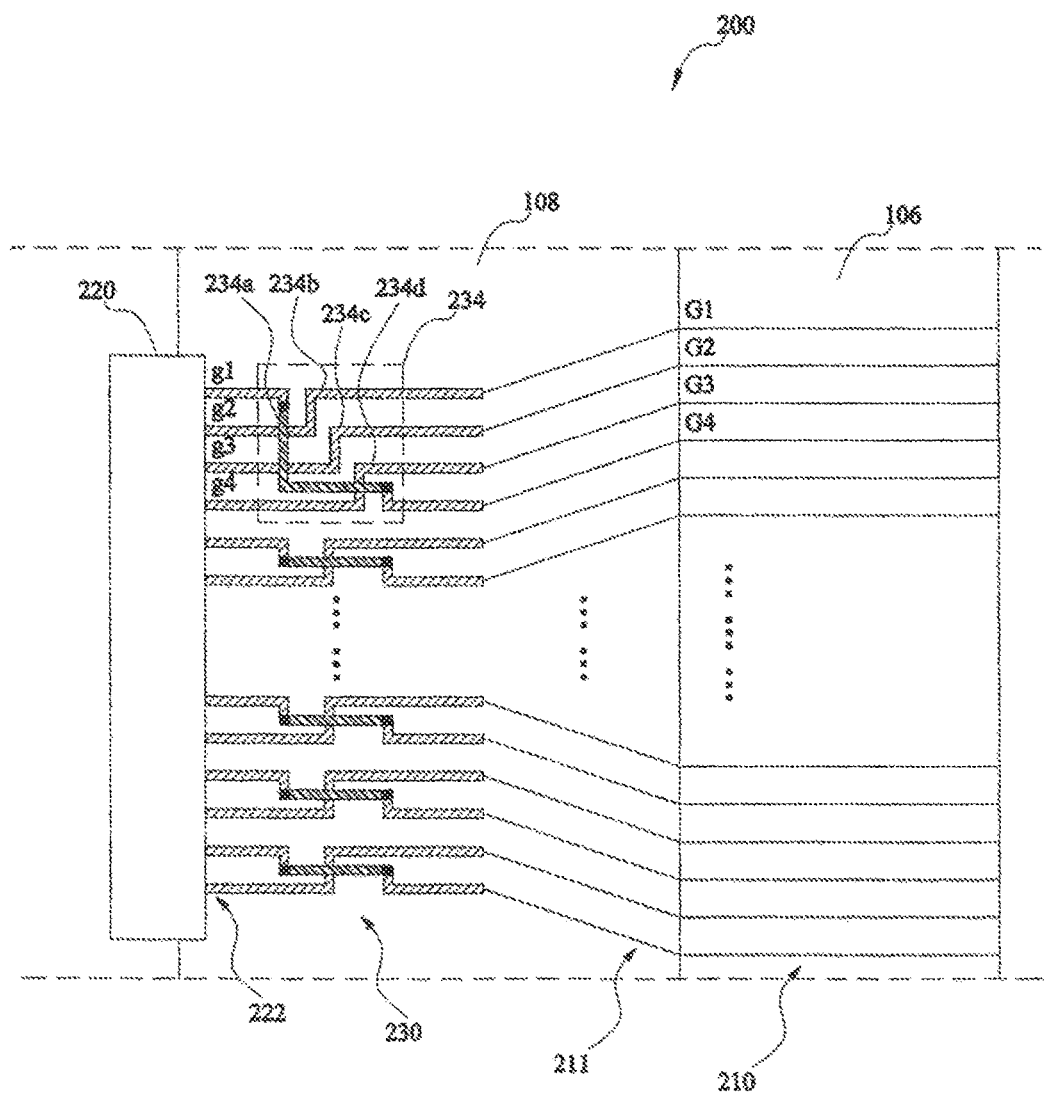
FIG. 2c is a schematic diagram showing another connecting layout area of an array substrate according to one embodiment of the present invention.

FIG. 2c is a schematic diagram showing another connecting layout area of an array substrate according to one embodiment of the present invention. Referring to FIG. 2c, in one embodiment of the present invention, wherein the plurality of line combinations include a four-line combination 234. The four-line combination 234 includes a first line combination 234a, a second line combination 234b, a third line combination 234c and a fourth line combination 234d. Wherein the second line combination 234b, the third line combination 234c and the fourth line combination 234d are configured as a polygonal line, and the first line combination 234a is in a cross-line configuration. Wherein the first line combination 234a is disposed between the output interface g1, the input interface G4 and the second line combination 234b is disposed between the output interface g2 and the input interface G1, the third line combination 234c is disposed between the output interface g3 and the input interface G2, and the fourth line combination 234d is disposed between the output interface g4 and the input interface G3. It is assumed that the timing sequence of the control signals passing through the output interfaces is from g1, g2, g3, then g4 (g1->g2->g3->g4) and the timing sequence of the control signals reaching the input interfaces is from G4, G1, G2, then G3 (G4->G1->G2->G3).

In some embodiments, in addition to the cross-line configuration, the plurality of connection lines are configured as a polygonal line, a straight line, a curved line, an oblique line and other configurations, but not limited thereto, and the continuing configuration depends on the designer's needs.

Figure 3:
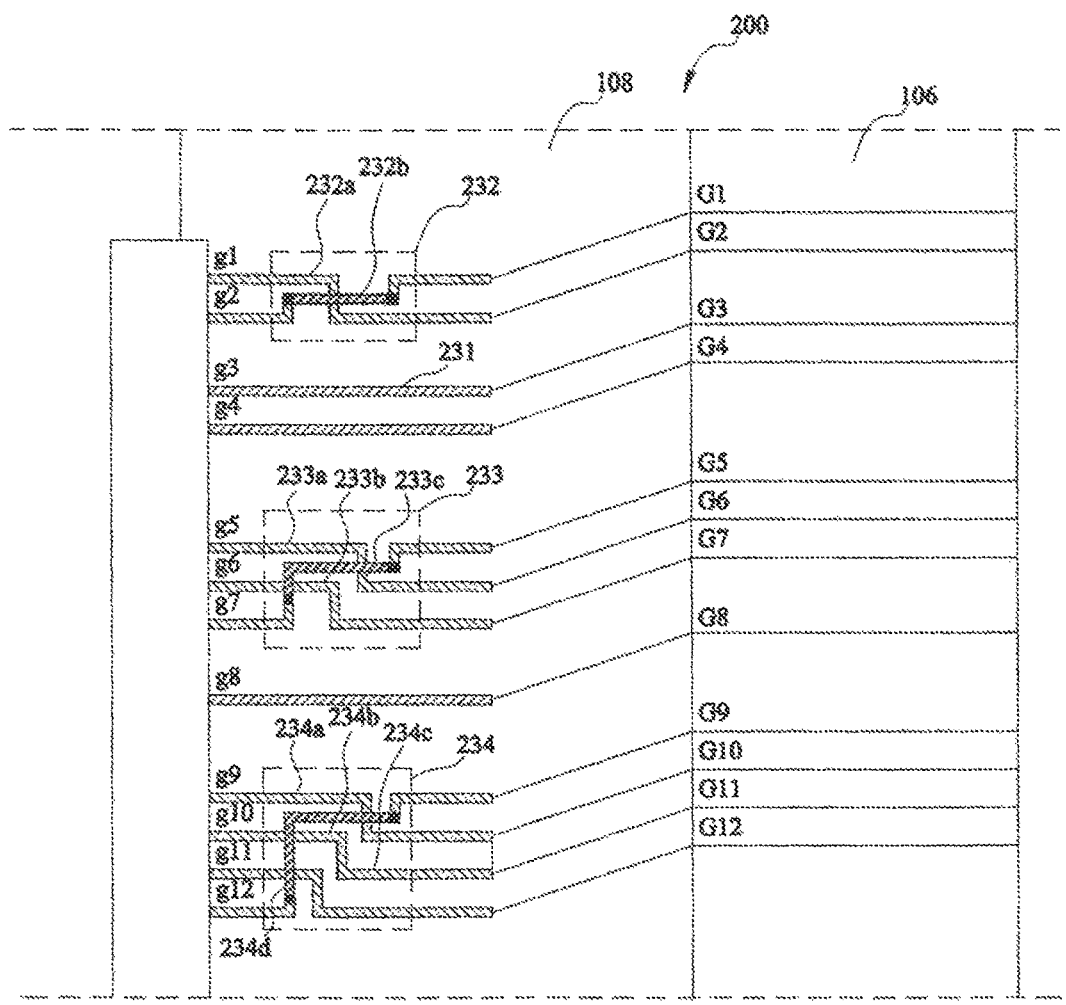
FIG. 3 is a schematic diagram showing another connecting layout area of an array substrate according to one embodiment of the present invention.

FIG. 3 is a schematic diagram showing another connecting layout area of an array substrate according to one embodiment of the present invention. Referring to FIG. 3, in one embodiment of the present invention, the plurality of output interfaces of the integrated circuit are ordered from g1 to g12 sequentially (g1->g12), however, the timing sequence of the control signals passing through the output interfaces is with a sequence of g2, g1, g3, g4, g7, g8, g5, g6, g12, g9, g10 and then g11 (g2->g1->g3->g4->g7->g8->g5->g6->g12->g9->g10->g11). Wherein the ordering of the plurality of output interfaces of the integrated circuit is different from the ordering of the timing sequence of the control signals, and the timing sequence of the control signals reaching the input interfaces is with a sequence of G1 to G12 sequentially (G1->G12). Therefore, a plurality of different multi-line combinations can be used for mixing, and the connecting lines of the multi-line combinations are connected between the plurality of output interfaces and the plurality of input interfaces. Wherein the plurality of connecting lines can connect the plurality of input interfaces and the plurality of output interfaces one by one correspondingly, and the timing sequence of the control signals transmitted between the plurality of input interfaces and the plurality of output interfaces are also the same as one by one, that is, with the same sequence of the plurality of connecting lines.

As shown in FIG. 3, in one embodiment of the present invention, wherein the plurality of connecting lines include a two-line combination 232, a three-line combination 233, a four-line combination 234, and a corresponding line combination 231. Wherein the two-line combination 232 includes a first line combination 232a and a second line combination 232b. Wherein the first line combination 232a is configured as a polygonal line and the second line combination 232b is in a cross-line configuration. Wherein the first line combination 232a is disposed between the output interface g1 and the input interface G2 and the second line combination 232b is disposed between the output interface g2 and the input interface G1.

Wherein the three-line combination 233 includes a first line combination 233a, a second line combination 233b and a third line combination 233c. Wherein the first line combination 233a and the second line combination 233b are configured as a polygonal line, and the third line combination 233c is in a cross-line configuration. Wherein the first line combination 233a is disposed between the output interface g5, the input interface G6, the second line combination 233b is disposed between the output interface g6 and the input interface G7, and the third line combination 233c is disposed between the output interface g7 and the input interface G5.

The four-line combination 234 includes a first line combination 234a, a second line combination 234b, a third line combination 234c and a fourth line combination 234d. Wherein the first line combination 234a, the second line combination 234b and the third line combination 234c are configured as a polygonal line, and the fourth line combination 234d is in a cross-line configuration. Wherein the first line combination 234a is disposed between the output interface g9, the input interface G10 and the second line combination 234b is disposed between the output interface g10 and the input interface G11, the third line combination 234c is disposed between the output interface g11 and the input interface G12, and the fourth line combination 234d is disposed between the output interface g12 and the input interface G9.

Wherein the corresponding line combination 231 is disposed between the output interface g3 and the input interface G3, between the output interface g4 and the input interface G4, and between the output interface g8 and the input interface G8, respectively.

As such, the timing sequence of the output of the control signals of the integrated circuit is with a sequence of g2, g1, g3, g4, g7, g5, g6, g8, g12, g9, g10 and then g11 (g2->g1->g3->g4->g7->g5->g6->g8->g12->g9->g10->g11), and the timing sequence of the control signals reaching the input interfaces is conformed with a sequence of G1 to G12 sequentially (G1->G12).

In one embodiment of the present invention, wherein the driving module 220 includes a chip on film structure and is pressed on the edge of the substrate 200, and the chip on film structure includes a plurality of output interfaces 221.

In one embodiment of the present invention, wherein the chip on film structure is a gate electrode chip on film structure 105.

In one embodiment of the present invention, wherein the chip on film structure is a source electrode chip on film structure 104.

In one embodiment of the present invention, wherein the plurality of connecting lines 230 are disposed on a fan out region of the connecting layout area 108.

In one embodiment of the present invention, an array substrate of the present invention comprises a substrate 200 including a displaying area 106 and a connecting layout area 108 disposed on the periphery of the displaying area 106, a plurality of thin film transistors T, a plurality of sub-pixels P and a plurality of signal lines 210 disposed on the displaying area 106. Wherein the plurality of sub-pixels P are electrically coupled to the plurality of thin film transistors T respectively, the plurality of thin film transistors T are electrically coupled to the plurality of signal lines 210 respectively, and a plurality of input interfaces 211 of the plurality of signal lines 210 are disposed on the connecting layout area 108. Wherein the plurality of input interfaces 211 includes at least one first input interface G1 and at least one second input interface G2. Further, a driving module 220 includes at least one first output interface g1 and at least one second output interface g2, and two line combinations 232 are disposed between the driving module 220 and the substrate 200 and include a first line combination 232a and a second line combination 232b, wherein the first line combination 232a is disposed between the first output interface g1 and the second input interface G2 and the second line combination 232b is disposed between the second output interface g2 and the first input interface G1, the second line combination 232b is configured as a polygonal line, a straight line, a curved line or an oblique line, and the first line combination 232a is in a cross-line configuration.

In one embodiment of the present invention, a display panel of the present invention comprises an array substrate, an opposite substrate disposed opposite to the array substrate. Wherein the array substrate comprises a substrate 200 including a displaying area 106 and a connecting layout area 108 disposed on the periphery of the displaying area 106, a plurality of thin film transistors T, a plurality of sub-pixels P and a plurality of signal lines 210 disposed on the displaying area 103. Wherein the plurality of sub-pixels P are electrically coupled to the plurality of thin film transistors T respectively, the plurality of thin film transistors T are electrically coupled to the plurality of signal lines 210 respectively, and a plurality of input interfaces 211 of the plurality of signal lines 210 are disposed on the connecting layout area 108. Further, a driving module 220 is disposed on the connecting layout area 108 and includes a plurality of output interfaces 222, and a plurality of connecting lines 230 are disposed between the plurality of input interfaces 211 and the plurality of output interfaces 222 and configured to electrically couple the plurality of input interfaces 211 and the plurality of output interfaces 222 respectively. Wherein at least one of the plurality of connecting lines 230 is in a cross-line configuration, a line configuration sequence of the plurality of input interfaces 211 is different from a line configuration sequence of the plurality of output interfaces 222.

In one embodiment of the present invention, wherein the array substrate further includes any one of the foregoing embodiments.

In some embodiments, the display panel described herein may be, for example, a liquid crystal display panel, which is not limited thereto. The display panel may also be an OLED display panel, a W-OLED display panel, a QLED display panel, a plasma display panel, a curved type display panel or other types of display panel.

Under the consideration of substantially not to alter the existing production process, the display panel equipped with the array substrate of the present invention is possible to maintain the original process requirements and product costs. By virtue of the arrangement of the connecting lines on the connecting layout area of the present invention, it can change the timing sequence of the control signals for displaying area of the display panel and no need to change the timing sequence of the output signals of a driving module such as a driver IC or a drive control circuit, therefore, the adjusting cost of the driving module can be reduced.

In addition, in the specification, unless explicitly described to the contrary, the word "comprise" and variations such as "comprises" or "comprising" will be understood to imply the inclusion of stated elements but not the exclusion of any other elements.

The present invention has been described with a preferred embodiment thereof and it is understood that many changes and modifications to the described embodiment can be carried out without departing from the scope and the spirit of the invention that is intended to be limited only by the appended claims.

What is claimed is:

1. An array substrate, comprising:
    a substrate, including a displaying area and a connecting layout area disposed on the periphery of the displaying area, a plurality of thin film transistors, a plurality of sub-pixels and a plurality of signal lines disposed on the displaying area, wherein the plurality of sub-pixels are electrically coupled to the plurality of thin film transistors respectively, the plurality of thin film transistors are electrically coupled to the plurality of signal lines respectively, and a plurality of input interfaces of the plurality of signal lines are disposed on the connecting layout area;
    a driving module, disposed on the connecting layout area and including a plurality of output interfaces; and
    a plurality of connecting lines, disposed between the plurality of input interfaces and the plurality of output interfaces, configured to electrically couple the plurality of input interfaces and the plurality of output interfaces respectively;
    wherein at least one of the plurality of connecting lines is in a cross-line configuration, a line configuration sequence of the plurality of input interfaces is different from a line configuration sequence of the plurality of output interfaces.

2. The array substrate according to claim 1, wherein the plurality of connecting lines include a plurality of line combinations.

3. The array substrate according to claim 2, wherein at least one of the plurality of line combinations is in a cross-line configuration.

4. The array substrate according to claim 2, wherein the plurality of line combinations include at least one of a two-line combination, a three-line combination, and a four-line combination.

5. The array substrate according to claim 2, wherein the driving module outputs a plurality of control signals through the plurality of output interfaces in a first time sequence, the plurality of control signals received by the plurality of input interfaces are continued in a second time sequence, and the plurality of connecting lines are configured to receive the plurality of control signals through the plurality of output interfaces with the first time sequence and to transmit the plurality of control signals to the plurality of input interfaces with the second time sequence.

6. The array substrate according to claim 1, wherein the driving module includes a chip on film structure and is pressed on the edge of the substrate.

7. The array substrate according to claim 6, wherein the chip on film structure includes a plurality of output interfaces.

8. The array substrate according to claim 6, wherein the chip on film structure is a gate electrode chip on film structure.

9. The array substrate according to claim 6, wherein the chip on film structure is a source electrode chip on film structure.

10. The array substrate according to claim 1, wherein the plurality of connecting lines are disposed on a fan out region of the connecting layout area.

11. An array substrate, comprising:
    a substrate, including a displaying area and a connecting layout area disposed on the periphery of the displaying area, a plurality of thin film transistors, a plurality of sub-pixels and a plurality of signal lines disposed on the displaying area, wherein the plurality of sub-pixels are electrically coupled to the plurality of thin film transistors respectively, the plurality of thin film transistors are electrically coupled to the plurality of signal lines respectively, and a plurality of input interfaces of the plurality of signal lines are disposed on the connecting layout area, wherein the plurality of input interfaces include at least one first input interface and at least one second input interface;

a driving module, including at least one first output interface and at least one second output interface; and two line combinations, disposed between the driving module and the substrate and including a first line combination and a second line combination, wherein the first line combination is disposed between the first output interface and the second input interface and the second line combination is disposed between the second output interface and the first input interface, the second line combination is configured as a polygonal line, a straight line, a curved line or an oblique line, and the first line combination is in a cross-line configuration.

12. A display panel, comprising:

an array substrate, an opposite substrate, disposed opposite to the array substrate;

wherein the array substrate comprises:

a substrate, including a displaying area and a connecting layout area disposed on the periphery of the displaying area, a plurality of thin film transistors, a plurality of sub-pixels and a plurality of signal lines disposed on the displaying area, wherein the plurality of sub-pixels are electrically coupled to the plurality of thin film transistors respectively, the plurality of thin film transistors are electrically coupled to the plurality of signal lines respectively, and a plurality of input interfaces of the plurality of signal lines are disposed on the connecting layout area;

a driving module, disposed on the connecting layout area and including a plurality of output interfaces; and a plurality of connecting lines, disposed between the plurality of input interfaces and the plurality of output interfaces, configured to electrically couple the plurality of input interfaces and the plurality of output interfaces respectively;

wherein at least one of the plurality of connecting lines is in a cross-line configuration, a line configuration sequence of the plurality of input interfaces is different from a line configuration sequence of the plurality of output interfaces.

13. The display panel according to claim 12, wherein the plurality of connecting lines include a plurality of line combinations.

14. The display panel according to claim 13, wherein at least one of the plurality of line combinations is in a cross-line configuration.

15. The display panel according to claim 13, wherein the plurality of line combinations include at least one of a two-line combination, a three-line combination, and a four-line combination.

16. The display panel according to claim 13, wherein the driving module outputs a plurality of control signals through the plurality of output interfaces in a first time sequence, the plurality of control signals received by the plurality of input interfaces are continued in a second time sequence, and the plurality of connecting lines are configured to receive the plurality of control signals through the plurality of output interfaces with the first time sequence and to transmit the plurality of control signals to the plurality of input interfaces with the second time sequence.

17. The display panel according to claim 12, wherein the driving module includes a chip on film structure and is pressed on the edge of the substrate.

18. The display panel according to claim 17, wherein the chip on film structure includes a plurality of output interfaces.

19. The display panel according to claim 17, wherein the chip on film structure is a gate electrode chip on film structure.

20. The display panel according to claim 17, wherein the chip on film structure is a source electrode chip on film structure.

* * * * *